United States Patent
Streubel

(10) Patent No.: US 6,668,005 B2
(45) Date of Patent: Dec. 23, 2003

(54) PRE-FUSION OXIDIZED AND WAFER-BONDED VERTICAL CAVITY LASER

(76) Inventor: Klaus Streubel, 19140 Solleventuna, Sweden (DE)

( * ) Notice: Subject to any disclaimer, the term of this patent is extended or adjusted under 35 U.S.C. 154(b) by 24 days.

(21) Appl. No.: 09/832,112

(22) Filed: Apr. 11, 2001

(65) Prior Publication Data

US 2001/0046249 A1 Nov. 29, 2001

Related U.S. Application Data

(63) Continuation-in-part of application No. 09/225,680, filed on Jan. 6, 1999, now abandoned.

(30) Foreign Application Priority Data

Jan. 31, 1998 (GB) .............................................. 9802047

(51) Int. Cl.⁷ ................................................. H01S 5/00
(52) U.S. Cl. ........................................ 372/96; 372/45
(58) Field of Search ................................ 372/44–46, 50

(56) References Cited

U.S. PATENT DOCUMENTS

| 5,328,854 A | | 7/1994 | Vakhshoori et al. |
| 5,594,751 A | | 1/1997 | Scott |
| 5,754,578 A | * | 5/1998 | Jayaraman ................ 372/50 |
| 5,809,051 A | * | 9/1998 | Oudar ....................... 372/45 |
| 5,985,686 A | * | 11/1999 | Jayaraman ................ 438/32 |
| 6,177,302 B1 | * | 1/2001 | Yamazaki et al. ........ 438/158 |

FOREIGN PATENT DOCUMENTS

| WO | A1-9520254 | 7/1995 |

* cited by examiner

*Primary Examiner*—Paul Ip
*Assistant Examiner*—James Menefee
(74) *Attorney, Agent, or Firm*—Birch, Stewart, Kolasch & Birch, LLP

(57) ABSTRACT

It was proposed to combine two successful VCL technologies, wafer fusion and selective oxidation, in a new way to form a long wavelength VCL. The Al(ga)As oxidation is performed via fusion channels before the actual wafer fusion step. By doing so, the structure combines the advantages of two different, successful long wavelength VCL structures; the double fused and the single fused, oxygen implanted VCL.

12 Claims, 4 Drawing Sheets

PRE-FUSION OXIDIZED AND WAFER-BONDED VERTICAL CAVITY LASER

This is a continuation-in-part of U.S. Ser. No. 09/225,680 filed Jan. 6, 1999, now abandoned.

FIELD OF THE INVENTION

The present invention relates to a vertical cavity laser and more particularly, the present invention relates to the unique combination of wafer fusion and selective oxidation to form a long wavelength vertical cavity laser.

BACKGROUND OF THE INVENTION

The major obstacle for the fabrication of long-wavelength (1.3–1.55 µm) vertical cavity laser, VCL, is the lack of high reflective InP-based Bragg mirrors as well as the difficulty to realize effective electrical and optical confinement schemes The technology of wafer fusion as discussed in a paper entitled "Double-Fused 1.52 µm Vertical-Cavity Lasers," published in *Appl. Phys. Lett,* Vol. 64, (1994), p1463, is one solution to solve the mirror problem by utilizing GaAs/AlGaAs mirrors. Nearly all room temperature operating LW-VCLs (long wave vertical cavity lasers) in the art today make use of one or two wafer fused GaAs based mirrors.

Selective oxidation can be applied in a mesa structure, double fused VCSEL, realizing small current aperture in the p-side as reviewed in the article, "Laterally Oxidized Long Wavelength CW Vertical Cavity Lasers," published in *Appl. Phys. Lett.,* Vol. 69 (1996) p471. Very high operation temperatures (63° C. (cw.) and 120° C. (pulsed)) have been achieved with this technique as delineated in the paper, "120° C. Pulsed Operation From A 1.55 µm Vertical Cavity Laser," presented at the 1997 *LEOS Summer Topical Meetings,* Montreal, Canada. As a restriction, the structure involves two wafer fusion steps and two wafer fused heterojunctions inside the cavity, which complicate the fabrication process and generally affect the reliability of the device.

Very good results have been demonstrated recently with a single fused 1.3 µm device with one dielectric top mirror. This topic was reviewed in the article, "Sub-milliamp 1.3 µm Vertical-Cavity Surface-Emitting Lasers With Threshold Current Density<500 A/cm$^2$", *Electron. Lett.,* Vol. 33, (1997) p1052. Current confinement here is realized by oxygen implantation into a p-doped GaAs layer on a GaAs-based DBR. Submilliamp thresholds and threshold current densities around 600 A/cm$^2$ have been demonstrated with those devices. However, the oxygen implant sets some limits for the minimum laser diameter and might leak at temperatures above 40° C.

SUMMARY OF THE INVENTION

The present invention overcomes the constraints of the prior art methods and in accordance with one embodiment of the present invention, there is provided a vertical cavity laser, comprising:

a gallium arsenide semiconductor substrate body having a bottom surface and a top surface;

a planar contact on the bottom surface;

a mirror stack on the top surface, the mirror stack composed of a plurality of layers of GaAs and AlGaAs;

an active layer comprising multiple quantum well structure, the structure embedded cladding layers;

a plurality of channels in an oxidized layer of the mirror stack and the active layers, the channels in optical communication with the active layers and the mirror stack;

a dielectric mirror; and a ring contact surrounding the mirror.

The laser is formed by replacing oxygen implantation with a pre-fusion oxidation of an Al(Ga)As layer for electrical isolation. The lateral profile of the Al-oxide/semiconductor interface can be designed by changing the (low) Ga-content vertically within the Al(Ga)As oxidation layer as set forth in the article, "Estimation of Scattering Losses in Dielectric Apertured Vertical Cavity Lasers", printed in *App. Phys. Lett.,* Vol. 68 (1996), p1757 and in "Scattering Losses From Dielectric Apertures in Vertical-Cavity Lasers", *Journal of Selected Topics in Quantum Electronics",* (1997), p379. In analogy to short wavelength VCLs with oxide-apertures, small VCL diameters and thus very low threshold currents and high efficiencies can be realized. As in short wavelength devices, electric isolation can be maintained up to high temperatures.

The combination of the two technologies as discussed above result in a number of advantages. In comparison to the double fused VCL, the proposed structure offers a reduction in processing complexity by omitting the second fusion step. This improves the reliability of the device due to the reduced number of wafer fused heterojunctions inside the laser resonator. The epitaxial structure is planar and top emitting which is desirable for testing and packaging. The ring contact is placed on the n-side of the device where it benefits from the high mobility of the electrons. This assures a homogeneous current injection through the p-side oxygen current aperture and releases the demands on the otherwise critical top mirror dimensions. Furthermore, the Al-oxide is embedded inside the structure and thus automatically 'sealed'.

Having thus generally described the invention, reference will now be made to the accompanying drawings, illustrating preferred embodiments.

BRIEF DESCRIPTION OF THE DRAWINGS

Similar numerals employed in the text denote similar elements.

DETAILED DESCRIPTION OF THE PREFERRED EMBODIMENTS

As all wafer fused VCL, the device according to the invention makes use of the good thermal and optical properties of GaAs-based Bragg reflectors. Compared to the oxygen-implanted, single fused VCL, the mesa dimensions of the structure should be large enough to separate the mesa walls from the optical mode inside the laser.

The wavelength tuning between material gain and cavity resonance can be characterized accurately before the deposition of the dielectric mirror. The gain-cavity mode offset is one of the most critical design parameters for long wavelength VCSEL as set forth in "Temperature Sensitivity of 1.54 μm Vertical Cavity Lasers with an InP based Bragg Deflector" (to be published in *IEEE J. Quantum Electronics*). If necessary, the cavity mode can be shifted e.g. by controlled thinning of the n-InP spacer layer. This is a clear advantage compared to the double fused VCL, where the cavity mode has to be adjusted with the thickness of the GaAs-layer on the p-mirror.

Figure 1:
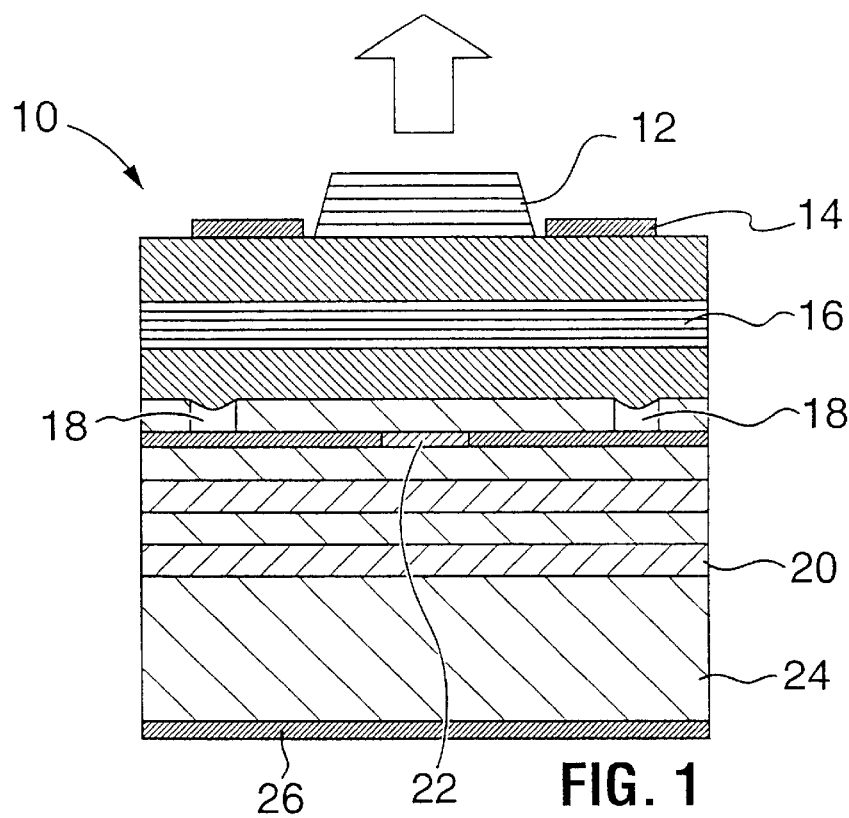
FIG. 1 is a schematic cross-section of the laser according to one embodiment of the present invention.

Referring now to the drawings, FIG. 1 illustrates a cross-sectional view of the assembled laser, globally denoted by numeral 10. The laser 10 comprises a top side emission laser with a dielectric mirror 12 surrounded by an n-side ring contact 14. The contact 14 is mounted to the top surface of multiple quantum well active layer 16 to be discussed in greater detail in the description for FIGS. 2a through 2i. Fusion channels 18 formed during the fabrication of the laser 10 facilitate optical communication between active layer 16 and mirror stack 20. The mirror stack 20 provides a plurality of AlGaAs and GaAs layers with a thickness of a quarter optical wavelength. An oxide aperture 22 permits optical transmission from the mirror stack 20 to the channels 18. A GaAs substrate 24 is provided beneath mirror stack 20. Substrate 24 includes a planar p contact 26.

Figures 2A, 2B:
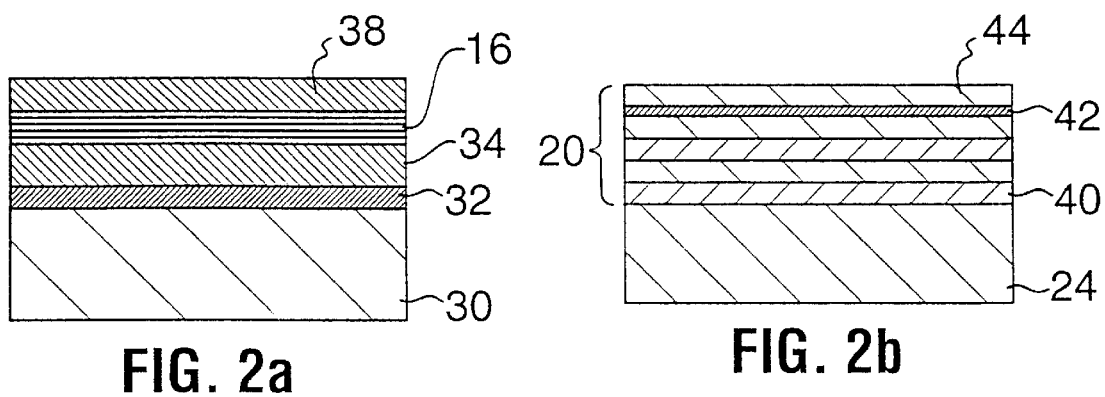
FIG. 2*a* is a schematic cross-section of the InP substrate and accompanying layers.
FIG. 2*b* is a schematic cross-section of the gallium arsenide substrate and accompanying layers.

With respect to FIGS. 2a through 2i, the overall process for fabricating the laser 10 is sequentially depicted in cross-section. The fabrication starts with the epitaxial growth of the active material layers 16 (FIG. 2a) and the GaAs/AlGaAs Bragg mirror stack 20 as shown in FIG. 2b. The active layer initial has an InP substrate 30, a GaInAsP etch stop 32, n-InP spacer 34, strain compensated multiple quantum wells (MQW) 16 and p-InP fusion layer 38. To meet the demands on low transparency and high differential gain, strained quantum wells are necessary to produce room temperature lasing operation. Depending on the cavity losses, between 7 and 15 quantum wells should be employed. Strain-compensating barriers, possibly with a constant As/P-ration throughout the MQW stack 16 might be necessary to avoid degradation during the high temperature fusion step. Compared to edge-emitting laser, the separate confinement region (SCH) is less important and might be eliminated. Embedding the quantum wells in InP might even improve the temperature performance of the lasers by reducing the carrier leakage out of the MOW region.

In FIG. 2b, the mirror stack 20 is epitaxially grown on the GaAs substrate 24 and includes p-AlGaAs/GaAs layers 40, Al(Ga)As oxidation layer 42 and P-GaAs fusion layer 44. The p-doped AlGaAs/GaAs mirror 20 must be optimized for low electrical resistance at low optical absorption at the lasing wavelength. The mirror design can be largely the same as for short wavelength VCLS, but with a reduced doping level close to the active region (Appl. Phys. Lett.) supra. Carbon is the preferred doping element. The AlGa)As oxidation layer is grown together with a GaAs fusion layer on top of this mirror. A small amount of Ga (2–5%) is added to the AlAs-oxidation layer in order to slow down the oxidation speed and to improve the diameter control. The wafer-fused interface should be placed in a node of the standing electromagnetic field inside the cavity to keep the optical losses down. The position of the oxidation layer can be placed close to the node for electrical confinement only. However, optical confinement should also be possible by grading the aperture profile and placing it in the vicinity of an optical anti-node.

Figure 2C:
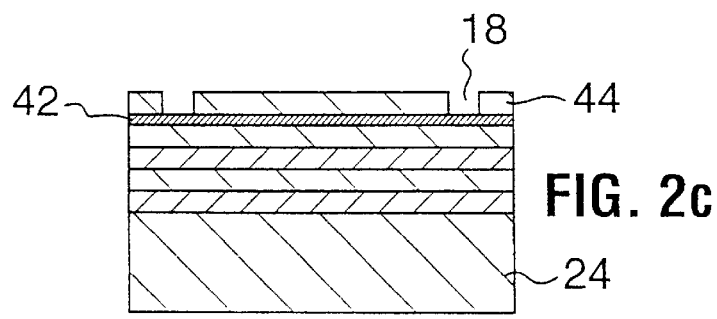
FIG. 2*c* is a schematic cross-section of the gallium arsenide substrate illustrating the disposition of the channels.
Figure 2D:
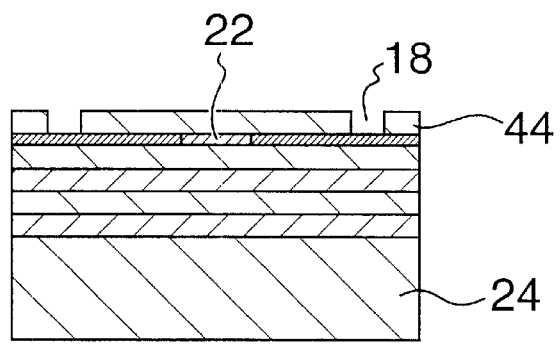
FIG. 2*d* is a schematic cross-section of the gallium arsenide substrate subsequent to an oxidation step.

Before wafer fusion, channels 18 are etched selectively into the GaAs fusion layer 44, exposing the Al(Ga)As oxidation layer 42. This is shown in FIG. 2c. It has been shown that the use of fusion channels, usually etched into the InP sample, improves the quality of the fused interface as discussed in "Double-Fused Long-Wavelength Vertical-Cavity Lasers", Babic, D. I., Ph.D thesis, University of California, Santa Barbara 1995. In the present invention, the channels were etched into the GaAs surface so that they could be used for the oxidation step.

Figure 3A:
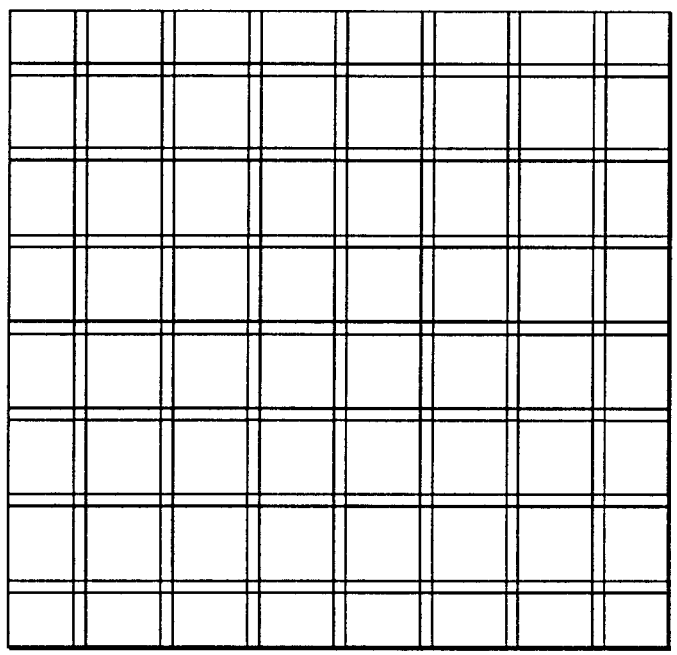
FIG. 3*a* is a plan view of one embodiment of the channel layout.
Figure 3B:
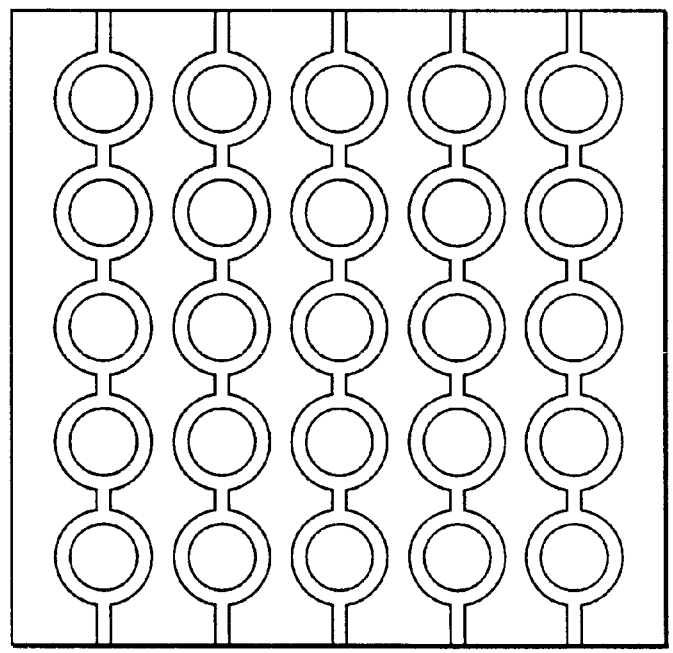
FIG. 3*b* is a plan view of a second embodiment of the channel layout.

Typical values for channel width and spacing are 10 μm and 150–300 μm, respectively. The simplest arrangement of fusion channels is a square network as shown in FIG. 3a, leaving square mesas of e.g. 150 μm×150 μm. A variety of other channel arrangements for different laser shapes or arrays are possible. As an example, FIG. 3b shows a channel layout that results in arrays of round mesas of identical diameter.

Channels 18 are used to selectively oxidize the exposed Al(Ga)As layer 42 to its native oxide in a water vapor environment. This is broadly illustrated in FIG. 2d. Wet oxidation is a relatively simple and well-established technology for VCLs which has led to a tremendous progress in developing ultra-low threshold and high efficient GaAs-based devices. This was studied by Huffaker in the article, "Transverse Mode Behavior in Native-Oxide-Defined Low Threshold Vertical Cavity Lasers", *Appl. Phys. Lett.*, Vol. 13 (1994) p1611 and by Lear in the article "Selectively Oxidized Vertical-Cavity Surface-Emitting Lasers with 50% Power Conversion Efficiency", *Elect. Lett.*, Vol. 31 (1995) p208. The oxidation process is interrupted such that non-oxidized openings 22 with diameters between 5 and 15 mm are left for current injection.

Figure 2E:
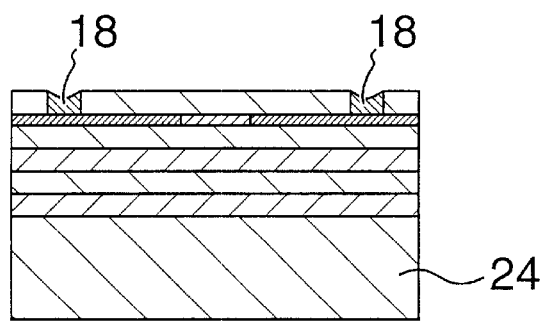
FIG. 2*e* is a schematic cross-section of the gallium arsenide substrate with oxide protection illustrated.
Figure 2F:
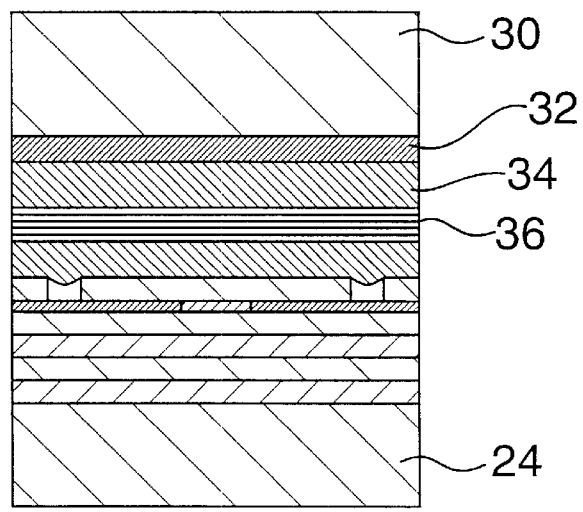
FIG. 2*f* is a schematic cross-section of the fused wafer.
Figure 2G:
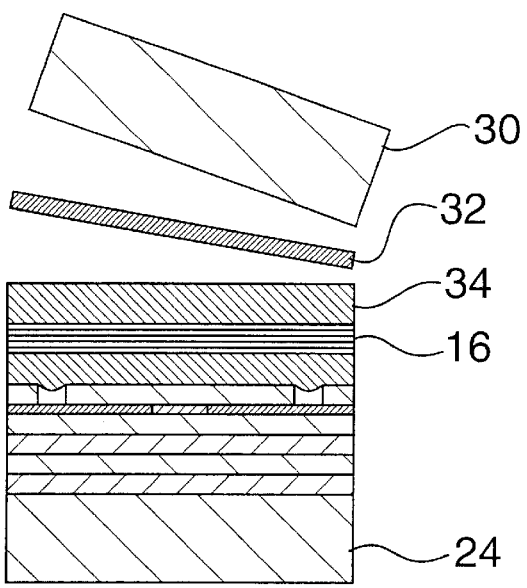
FIG. 2*g* is a schematic cross-section of the wafer after substrate removal.
Figure 2H:
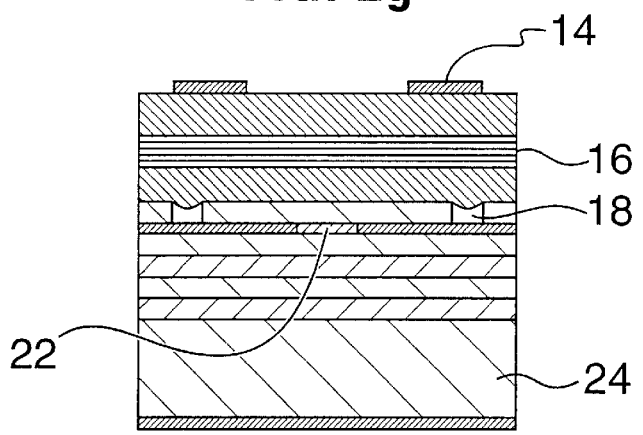
FIG. 2*h* is a schematic cross-section of the laser with the contacts in position.
Figure 2I:
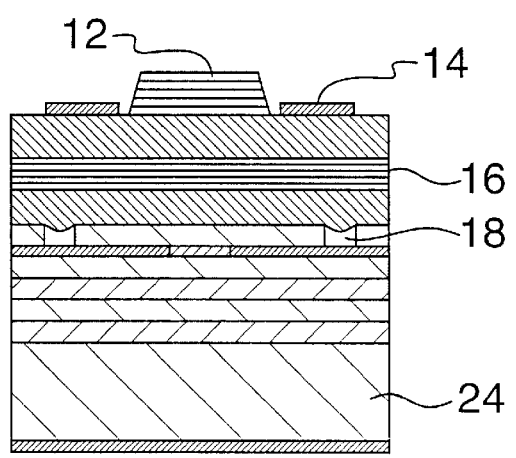
FIG. 2*i* is a schematic cross-section of the laser with the mirror in position.

After oxidation, the surfaces of both samples are cleaned for the wafer-fusion process. The cleaning procedure is very critical, especially for the electrical properties of the fused interface as discussed by Salomonsson, in "Water Fused pInP/p-GaAs Heterojunctions" J. Appl. Phys., Vol. 83 (1998). The usual procedures of Salomonsson and Babic, supra were modified in order to remove the oxides on the GaAs-surface with as little as possible impact on the native Al-oxide. Optionally the channels 18 may be protected by filling them with e.g. photo resist or $Si_2N_3$ as indicated in FIG. 2e. The subsequent fusion process shown in FIG. 2f is performed for approximately 30 min at the lowest possible fusion temperature (560° C.). The InP substrate 30 and the GaInAsP-etch stop layer 32 are removed by selective wet chemical etching. At this stage, the embedded fusion channels 18 are visible on the sample surface, which can be used to align the top-side ring contacts 14. After contact alloying, a dielectric mirror 12 is deposited inside the contact ring over the oxidized aperture 22. The mirror diameter can be much larger than the aperture diameter because of the high mobility of the n-side carriers (electrons). Depending on the dielectric materials, the mirror diameters either are defined by lift off (Si/SiO2, ZnSe/MgF) or dry etching (SiC/SiO2, Si2N3/SiO2).

As alternatives, the dielectric mirror 12 may be grown epitaxially and comprise metamorphic or a fused stock of semiconductor material. Further, it will be understood that the laser will be top emitting or bottom emitting.

Although embodiments of the invention have specifically described, it will be appreciated to those skilled that the invention is subject to substantial change without departing from the spirit, nature and scope of the present invention.

I claim:

1. A vertical cavity laser, comprising:
   a gallium arsenide semiconductor substrate body having a bottom surface and a top surface;
   a planar p-contact on said bottom surface;
   a mirror stack on said top surface, said mirror stack composed of a plurality of layers of GaAs/AlGaAs;
   an oxidation layer over said mirror stack having a pattern of selectively oxidized regions therein;
   a fusion layer overlying said oxidation layer;
   a network of channels in said fusion layer being coextensive with said pattern of selectively oxidized regions in said oxidation layer;
   an active multiple quantum well structure including cladding layers fused to said fusion layer; structure
   a dielectric mirror; and
   a ring contact surrounding said dielectric mirror.

2. The vertical cavity laser as set forth in claim 1, wherein said laser is a long wavelength laser.

3. The vertical cavity laser as set forth in claim 1, wherein said multiple quantum well includes between 7 to 15 quantum wells.

4. The vertical cavity laser as set forth in claim 1, wherein said mirror stack is p-doped.

5. The vertical cavity laser as set forth in claim 4, wherein said mirror stack is doped with carbon.

6. The vertical cavity laser as set forth in claim 1, wherein said channels are in spaced relation.

7. The vertical cavity laser as set forth in claim 1, wherein said channels have a width of 10 $\mu$m and a spacing from between 150–300 microns.

8. The vertical cavity laser as set forth in claim 1, wherein said oxidation layer is Al(Ga)As.

9. The vertical cavity laser as set forth in claim 8, wherein said fusion layer is GaAs.

10. The vertical cavity laser as set forth in claim 9, wherein said planar contact is p-type and said ring contact is n-type.

11. The vertical cavity laser as set forth in claim 1, wherein said oxidation layer further includes an aperture for permitting optical transmission therethrough.

12. The vertical cavity laser as set forth in claim 1, wherein said channels are filled.

* * * * *